United States Patent [19]

Werth et al.

[11] 4,410,764
[45] Oct. 18, 1983

[54] SPEECH PROCESSOR FOR PROCESSING ANALOG SIGNALS

[75] Inventors: Willard F. Werth; Robert L. Craiglow, both of Cedar Rapids, Iowa

[73] Assignee: Rockwell International Corporation, El Segundo, Calif.

[21] Appl. No.: 278,017

[22] Filed: Jun. 29, 1981

[51] Int. Cl.³ .............................................. G10L 1/00
[52] U.S. Cl. .................................. 364/513.5; 333/14; 455/116; 381/108
[58] Field of Search .................... 179/1 VL, 1 A, 1 P, 179/1 SA, 15.55 R; 455/47, 109, 116, 126; 333/14; 364/513, 725

[56] References Cited

U.S. PATENT DOCUMENTS

| 3,484,556 | 12/1969 | Flanagan et al. | 179/1 SA |
| 3,789,143 | 1/1974 | Blackmer | 179/1 VL |
| 3,970,937 | 7/1976 | Bates et al. | 455/47 |
| 4,103,239 | 7/1978 | Meewezen | 455/109 |
| 4,208,548 | 6/1980 | Orban | 179/1 VL |

Primary Examiner—Emanuel S. Kemeny
Attorney, Agent, or Firm—Richard K. Robinson; Howard R. Greenberg; H. Fredrick Hamann

[57] ABSTRACT

Peak-limiting AGC for increased average power SSB transmission is improved by deriving a gain-control signal using Hilbert transform detection techniques to obtain a modulated envelope signal which is compared with a peak clipping reference to form the limiting gain-control signal.

18 Claims, 9 Drawing Figures

SPEECH PROCESSOR FOR PROCESSING ANALOG SIGNALS

BACKGROUND OF THE INVENTION

This invention relates to voice processors and in particular to peak limiting voice processors for single sideband radio communications.

In radio communication systems it is desirable to maximize the use of transmitter power for the broadcasting of information. This is especially true in the area of Single Sideband (SSB) transmissions where the power output of most SSB transmitters is peak power limited rather than average power limited, while the broadcast information (intelligibility) in noise and interference is determined primarily by the average power of the transmitter. Therefore, it is desirable to maximize the average power of an SSB transmitter. More average power can be transmitted with an SSB signal if the peak-to-average power ratio of the SSB signal is reduced from a typical 17 dB peak-to-average power ratio of an unprocessed single sideband voice (audio) signal. This reduction facilitates more average power being transmitted, and thus improves the intelligibility and signal-to-noise ratio of the received signal.

In the prior art, there are three major techniques used to reduce the peak-to-average power ratio of single sideband transmitters. One technique is the use of audio volume compression which reduces the peak-to-average power ratio of the single sideband transmitter by typically 1 dB. A more significant reduction in the SSB's peak-to-average power ratio is achievable by symmetrical clipping of the positive and negative voltage peaks of either the audio waveform (signal) prior to SSB modulation (audio premodulation clipping) or the IF waveform (signal) after SSB modulation (SSB peak clipping). SSB peak clipping has been preferred over audio premodulation clipping. Many of the clipping distortion products resulting from SSB peak clipping fall outside of the IF passband, while the corresponding distortion products in audio premodulation clipping fall back into the desired audio passband. As a result, the inband distortion generated for a given amount of clipping is less for SSB peak clipping than for audio premodulation clipping. Additionally, the SSB waveform or signal is not related to the audio input waveform or signal in a simple manner and SSB peak clipping of the audio signal does not guarantee a reduction of SSB's peak-to-average power ratio under all conditions. Voice symmetrical audio premodulation clipping of 18 dB typically reduces the SSB's peak-to-average power ratio by 4 dB. In contrast, 18 dB of symmetrical SSB peak clipping typically reduces the SSB's peak-to-average power ratio by 8 dB and produces less inband distortion.

Symmetrical peak clipping of the modulated SSB waveform (signal) is generally preferred to clipping of the audio waveform prior to modulation. There are, however, disadvantages to peak clipping of the SSB signal. These include the requirements for a post clipping Intermediate Frequency (IF) or Radio Frequency (RF) filtering to remove spectrum splatter caused by distortion products. Spectrum splatter is defined as a broading over frequency of the concentration of the transmitted energy. An IF or RF filter is more costly than the audio filter used to remove out-of-band spectrum splatter in audio premodulation clipping. It is generally simpler and more economical to clip at audio frequencies than at intermediate frequencies or radio frequencies.

One of the prior art circuits that avoids some of the above enumerated problems provides for generating an SSB signal at IF frequencies, peak clipping this signal, filtering it, and converting it back to audio frequencies. The converted signal is then used to modulate an SSB transmitter. The resulting SSB envelope is limited as if SSB peak clipping had been used in the transmitter. This embodiment requires the additional cost and circuitry of a separate SSB modulator. In addition, care must be taken to prevent the SSB IF signal from leaking into the transmitter and interfering (mixing) with the SSB transmissions.

SUMMARY OF THE INVENTION

A speech processor for processing an audio analog signal that is going to be transmitted by an SSB transmitter includes a Hilbert transformer or a wideband 90° phase shifting network for obtaining a quadrature phase signal and an inphase signal of the audio analog signal. The inphase signal is amplified by a variable gain amplifier which performs audio amplitude processing on it and is, after processing, broadcasted by an SSB transmitter. The gain of the variable gain amplifier is set by a signal that is generated from a mathematically combined signal that is obtained by taking the square root of the sum of the squares of the inphase signal and the quadrature phase signal to obtain a modulated envelope signal. The modulated envelope signal is compared to the reference signal and the results of this comparison are used to control the gain of the variable gain amplifier that performs the audio processing of the inphase signal.

There are two embodiments of the speech processor provided as well as two methods of performing the mathematical combining of the inphase signal with the quadrature phase signal to obtain the square root of the sum and the squares of the inphase signal and the quadrature phase signal.

It is the objective of this invention to provide a speech processor for audio amplitude processing of an audio signal for SSB transmission that results in the SSB transmitter's peak-to-average power ratio being reduced by 8 dB.

It is another objective of this invention to provide a speech processor which provides for symmetrical limiting of the positive and negative voltage peaks of the IF or RF voltage waveforms produced during SSB transmission by an SSB transmitter utilizing the speech processor.

It is yet another objective of this invention to provide a speech processor for a single sideband transmitter that does not require a post clipping IF or RF filter to remove spectrum splatter.

BRIEF DESCRIPTION OF THE DRAWINGS

The advantages of the present invention may be ascertained from a reading of the specification and claims in conjunction with the drawings in which:

DETAILED DESCRIPTION OF THE PREFERRED EMBODIMENT

Figure 1:
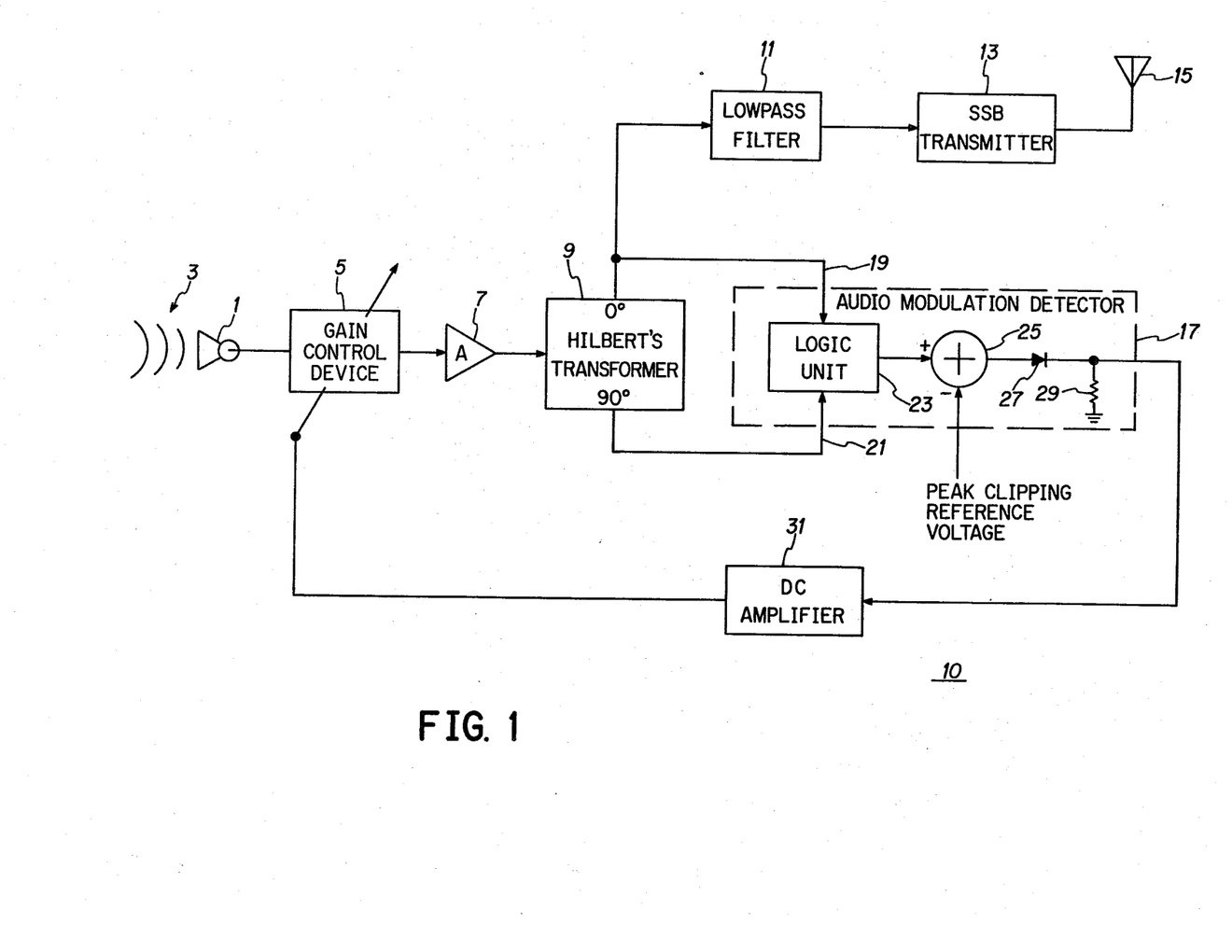
FIG. 1 is a block diagram of an SSB transmitter with a speech processor according to the invention.

In FIG. 1, to which reference should now be made, there is shown a block diagram of a single sideband transmitter 13 with a speech processor 10 that transmits an audio signal from an audio signal source, such as a microphone 1. The microphone 1 converts sound waves 3 into an electrical analog signal for application to a gain control device 5. The gain control device 5 modulates the analog signal from the audio signal source 1 and, consequently, the amplitude of the analog signal is modulated and then applied to an amplifier 7. The amplifier 7 amplifies the amplitude modulated analog signal that is provided by the gain control device 5. The amplified amplitude modulated analog signal is applied to a Hilbert transformer 9 or wideband 90° phase shift network to obtain an inphase signal and a quadrature phase signal of the amplitude modulated analog signal. The Hilbert transformer 9 is defined as a device that performs a wideband 90° phase shift on an incoming signal and provides as an output an inphase signal and a quadrature phase signal that have a 90° phase relationship with each other. The inphase signal is provided on a zero degrees output terminal of the Hilbert transformer 9 and applied to a lowpass filter 11 which removes any out-of-band distortion products from the audio signal. The filtered inphase signal is then modulated, amplified and transmitted by an SSB transmitter 13 and an antenna 15.

The control of the gain control device 5 is provided by an audio modulation detector 17 by way of a DC amplifier 31. The audio modulation detector 17 accepts the inphase signal via a conductor 19 and the quadrature phase signal via conductor 21 and a 90° terminal on the Hilbert transformer 9. The audio modulation detector 17 has three basic units: a logic unit 23, a summing device 25, and a detector that includes a diode 27 and a resistor 29. The output of the audio modulation detector 17 is an analog peak limited modulated signal that is coupled to the gain control device 5 via the DC amplifier 31 for dynamically controlling the gain of the gain control device 5.

The logic unit 23 squares both the inphase signal, I(t), and the quadrature phase signal, Q(t); obtains the sum of the squares of the inphase signal and the quadrature phase signal; and extracts the square root of the sum of the squares of the inphase signal and the quadrature phase signal. This signal is directly proportional to the SSB envelope corresponding to the audio waveform and is denoted mathematically as $$E(t) = \sqrt{I(t)^2 + Q(t)^2}.$$

This output signal from the logic unit 23, E(t), is applied to the positive terminal of summing device 25. This summing device 25, through summation, compares E(t) to a peak clipping reference voltage that is applied to the negative terminal of the summing device 25. For the embodiment shown in FIG. 1, when E(t) is greater than the peak clipping reference voltage as detected by the summing device 25 and provided as a difference signal, the difference signal is passed by the diode 27. The current that flows through the diode 27, as a result of the difference signal, causes a limiting voltage to be developed across the resistor 29. This limiting voltage results from the comparison of the peak clipping reference voltage with E(t) and is only present when E(t) is greater than the peak clipping reference voltage, as detected by the summing device 75, and is used as the analog peak limiting modulation signal that is the limiting voltage amplified by the amplifier DC 31. The amplified analog peak limiting modulation signal drives the gain control device 5, and modulates the audio analog signal that is provided by the audio signal source 1.

Figure 2:
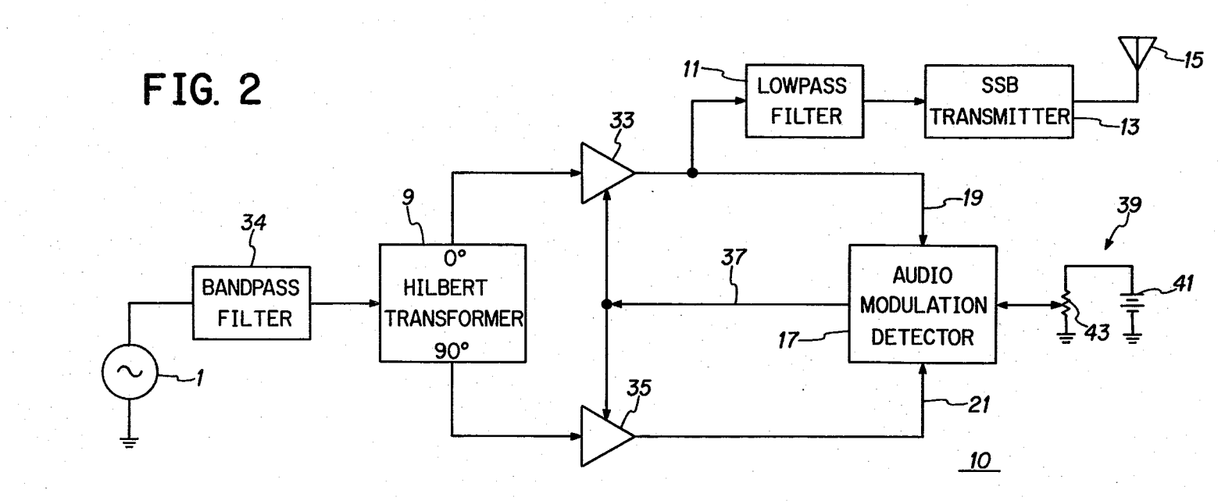
FIG. 2 is an alternate embodiment of an SSB transmitter with a speech processor according to the invention.

An alternate embodiment of a single sideband transmitter that has a speech processor associated with it is shown in FIG. 2, to which reference should now be made. As in the case of FIG. 1, an audio signal source 1 provides an analog signal. The analog signal is in the audio passband and is applied to a bandpass filter 34 for removal of unwanted noise and out-of-band frequencies. The filtered analog signal passes through the Hilbert transformer 9 where an inphase signal, I(t), is present on the zero degree output terminal and applied to an inphase variable gain amplifier 33 for amplification. The amplified inphase signal is applied via lowpass filter 11 to SSB transmitter 13 for modulation and transmission via the antenna 15 as well as to the audio modulation detector 17. The quadrature phase signal that is present on the 90° output terminal of the Hilbert transformer 9 is applied to a quadrature phase variable gain amplifier 35 for amplification. The amplified signal is applied via conductor 21 to the audio modulation detector 17 where the gain control for the inphase variable gain amplifier 33 and the quadrature phase variable gain amplifier 35 is obtained and applied to the amplifiers from the audio modulation detector 17 via conductor 37. The audio modulation detector 17 of FIG. 2 is identical to the audio modulation detector 17 of FIG. 1, and the peak clipping reference voltage is provided by reference supply 39 and includes a DC voltage source 41 and a variable resistor 43 that selects the desired peak clipping reference voltage for limiting the signal, E(t).

Figure 3:
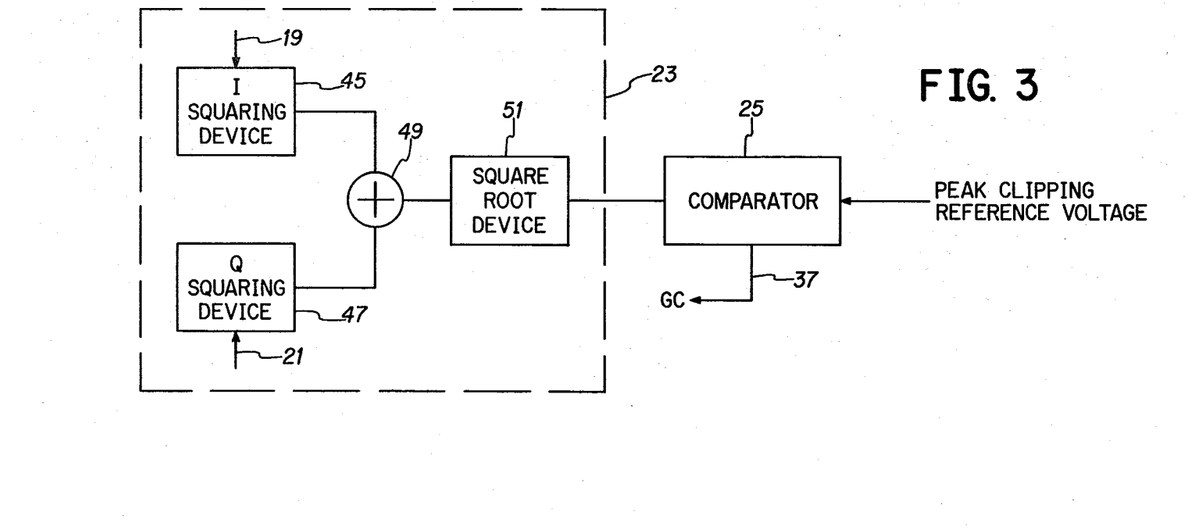
FIG. 3 is a block diagram of an audio modulation detector that is part of the speech processor of FIGS. 1 and 2.

FIG. 3 is a block diagram of the logic unit 23, and provides for an I squaring device 45, which squares the inphase signal, and a Q squaring device 47, which squares the quadrature phase signal. The inphase squared signal and the quadrature phase squared signal are summed by the summing device 49, and the square root of the sum of the squares is taken by the square root device 51. The output from the square root device 51 is, at any moment of time, a voltage E(t) that is directly proportional to the SSB envelope corresponding to the audio waveform represented mathematically by the equation $$E(t) = \sqrt{I(t)^2 + Q(t)^2}.$$

This equation illustrates the relationship of E(t) to the inphase signal I(t) and the quadrature phase signal Q(t). E(t) is compared to the peak clipping reference voltage by the comparator 25, and the gain control signal (GC) is provided on conductor 37.

Integrated circuits are readily available that can be used for obtaining the absolute values of signals and also for performing the multiplication and division of signals. Given the relationship for E(t) shown above, E(t) may be obtained by using the following identity:

$$E(t) = \sqrt{|I(t)|^2 + |Q(t)|^2} = \frac{|I(t)|^2}{E(t) + |Q(t)|} + |Q(t)|$$

Figure 4:
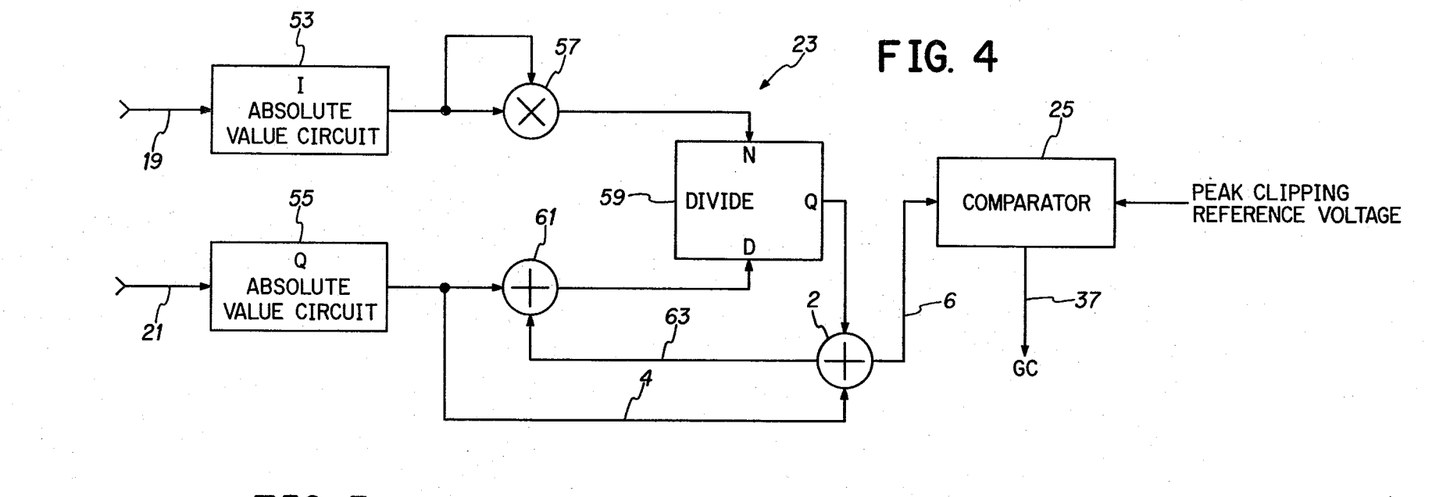
FIG. 4 is an alternate embodiment of the audio modulation detector of FIGS. 1 or 2.

The implementation of the above equation is illustrated in FIG. 4, where there is an I absolute value circuit 53 for obtaining the absolute value of the inphase signal, I(t), and a Q absolute value circuit 55 for obtaining the absolute value of the quadrature phase signal, Q(t). The absolute value of the inphase signal is squared by the multiplier 57, which receives on both its input terminals the absolute value of the inphase signal. The square of the absolute value of the inphase signal is applied to the divider 59 at the N port which is the numerator port. The denominator for the divider 59 is applied to the D port, which is a summation provided by a summing device 61 of the sum of the absolute value of the quadrature phase signal, Q(t); which is obtained by the Q absolute value circuit 55 and the output from a summing device 2. The summing device 2 sums the absolute value of the quadrature phase signal Q(t) which is applied to the summing device 2 via conductor 4 and the quotient which is present at the Q terminal output of the divider 59. The output of the summing device 2, E(t), is fedback via conductor 63 to the summing device 61. The output signal, E(t), from the summing device 2 is applied to the comparator 25 for comparison with the peak clipping reference voltage. The results of the comparison are applied to conductor 37 for gain controlling the gain of either the gain control device 5 of FIG. 1 or the inphase variable gain amplifier 33 and the quadrature variable gain amplifier 35 of FIG. 2.

Figure 5:
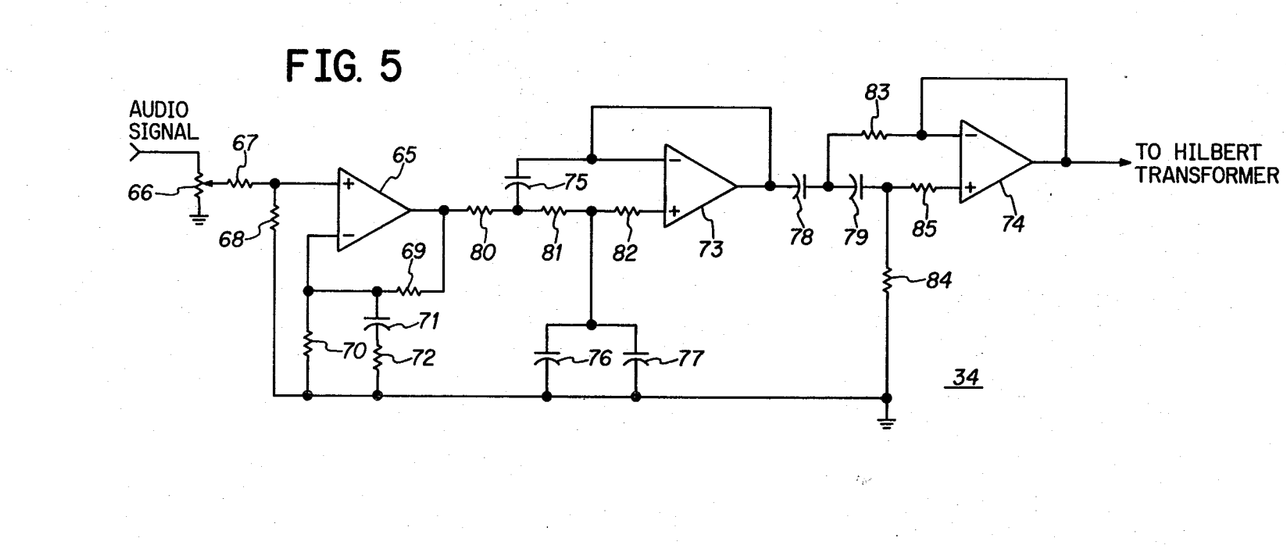
FIG. 5 is a schematic diagram of a bandpass filter that is associated with the speech processor of FIG. 2.

FIG. 5 is a schematic diagram of the bandpass filter 34 of FIG. 2, and includes an input amplifier 65 whose gain is established by the variable resistor 66, resistors 67 and 68 and feedback resistor 69. A reference potential (chassis ground) is coupled to the negative terminal of the input amplifier 65 via resistor 70. Preemphasis is provided by capacitor 71 and resistor 72. There are two active filter stages that include operational amplifiers 73 and 74, capacitors 75, 76, 77, 78 and 79; and resistors 80, 81, 82, 83, 84 and 85. The values of the resistors and capacitors used in the active filter stages are selected to provide a bandpass filter that will pass from 300 hertz to 3,000 hertz in the preferred embodiment.

Figure 6:
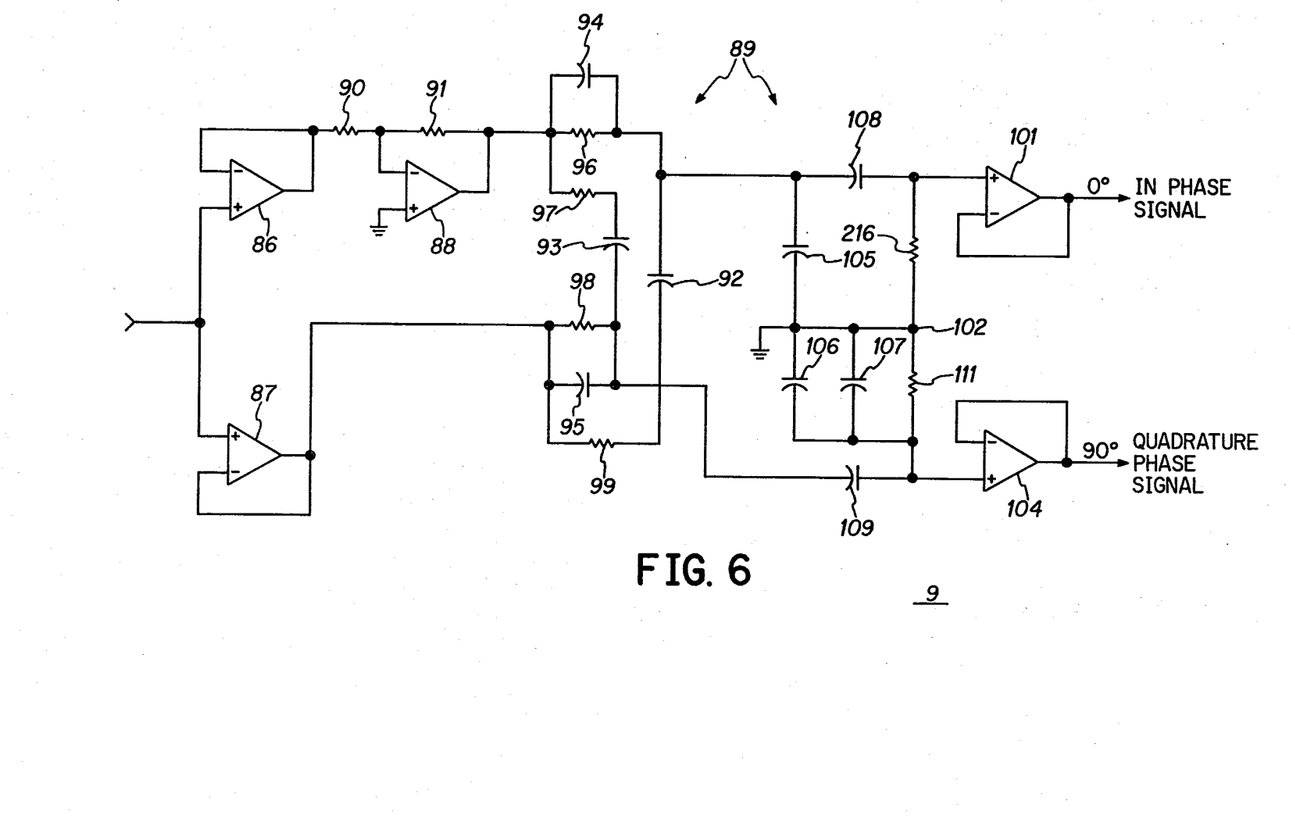
FIG. 6 is a schematic diagram of a wideband 90° phase shift network according to the invention.

The Hilbert transformer 9 is shown in FIG. 6 and includes two buffer amplifiers 86 and 87 that are arranged in voltage follower configurations. The output of the buffer amplifier 86 is applied to inverting amplifier 88, and the output of the amplifier 87 is applied to the phase shifting network 89. The gain of the amplifier 88 for the Hilbert transformer 9 inverting process should be, in the preferred embodiment, unity. This gain is established by resistors 90 and 91. The phase shifting network ensures that the inphase signal and the quadrature phase signal have a 90° phase relationship and includes capacitors 92, 93, 94, 95, 105, 106 and 107, and resistors 96, 97, 98, 99, 111 and 216. The output of the phase shifting network 89 is applied to two voltage follower circuits 101 and 104. The output of voltage follower 101 is at the zero degree terminal and provides the inphase signal, I(t); and the output of the voltage follower 104 provides the quadrature phase signal, Q(t), on the 90° terminal. The signals are in phase quadrature with each other and the voltage amplitude of the signals is established from the reference potential, or center point, that is present at node 102. The inphase signal from the phase shifting network is coupled to the voltage follower 101 by a capacitor 108, and the quadrature phase signal is coupled to the voltage follower 104 via capacitor 109.

Figure 7:
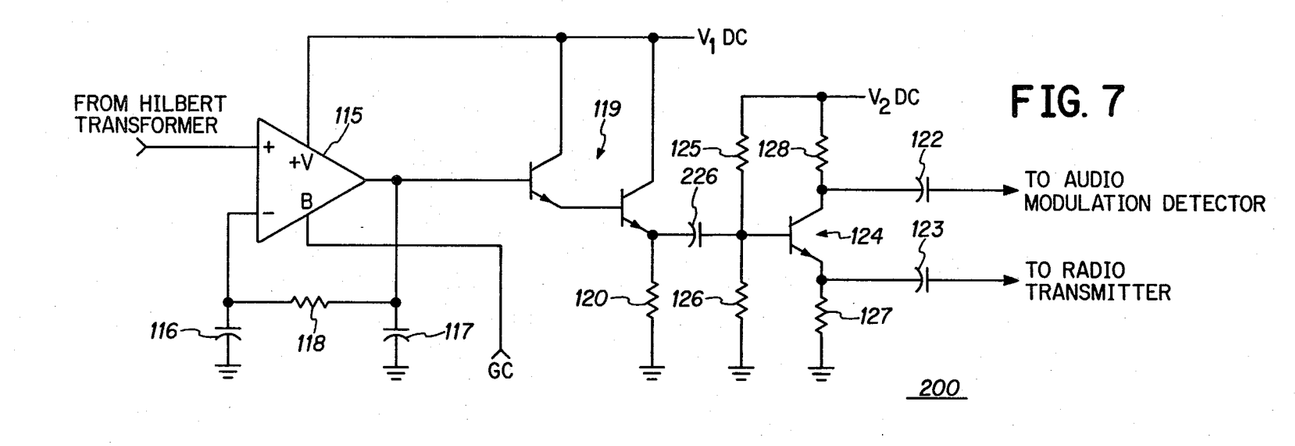
FIG. 7 is a variable gain amplifier according to the invention.

FIG. 7, to which reference should now be made, is a variable gain amplifier 200 that is used as both the inphase variable gain amplifier 33 and the quadrature phase variable gain amplifier 35. An operational amplifier 115 receives either the inphase signal, I(t), or the quadrature phase signal, Q(t), depending on whether the variable gain amplifier 200 is located in the inphase channel, as the inphase variable gain amplifier 33, or in the quadrature phase channel, as the quadrature phase variable gain amplifier 35 amplifies the received signal by the gain that is set by the magnitude of the gain control signal (GC) that is applied to the B terminal of the operational amplifier 115. Feedback resistor 118 provides stability for the operational amplifier 115, and filtering is provided by capacitors 116 and 117. Additional power amplification is provided by Darlington pair 119 with amplifier bias being established by an emitter resistor 120. Capacitor 226 couples the output from the Darlington pair 119 to the base of transistor 124. An output amplifier includes the transistor 124, which is biased by resistors 125 and 126, and has a base to collector signal gain that is established by resistor 127 and 128. The collector is connected to the audio modulation detector 17 via capacitor 122. When the variable gain amplifier 200 is used as the inphase variable gain amplifier 33, then the emitter of transistor 124 is connected to the radio transmitter via capacitor 123 and, in the embodiment of FIG. 2, capacitor 123 and the low-pass filter 11.

Figure 8:
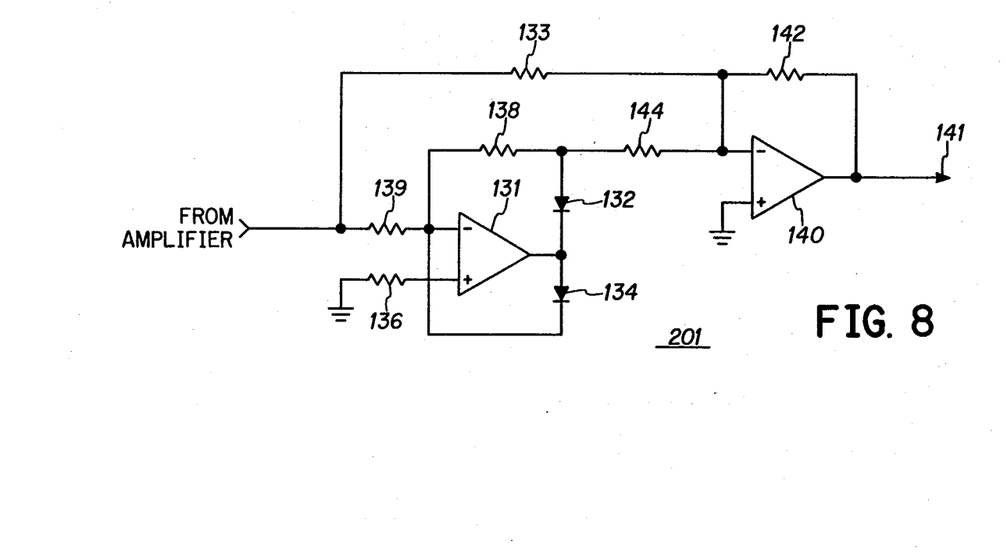
FIGS. 8 and 9 are schematic diagrams of an audio modulation detector according to the invention.

FIG. 8, to which reference should now be made, discloses an absolute value circuit 201, which is used for the I absolute value circuit 53 and the Q absolute value circuit 55, and is a precision full-wave rectifier that includes the operational amplifier 131, diodes 132 and 134, feedforward resistor 133, input resistors 136 and 139, and a feedback resistor 138. Operational amplifier 140 amplifies the full-wave rectified signal and the absolute value is provided on its output terminal 141. The input to operational amplifier 140 is provided by feedforward resistor 133 and summation resistor 144. Resistor 142 is a feedback resistor used to provide an adder configuration out of the circuit that includes operational amplifier 140 feedback resistors 133 and summation resistor 144.

The output of the I absolute value circuit 53 is applied to a multiplier 57 which, in the case of the preferred embodiment, is included in an integrated circuit multiplier/divider (illustrated in FIG. 9 to which reference should now be made) such as an RC 4200 from Raytheon Corporation, or may be obtained by use of discrete multipliers and dividers. Multiplier/divider 167 has two multiplier inputs, the first multiplier input terminal 1st and the second multiplier input terminal 2nd, for receiving I(t). Resistors 168 and 169 couple I(t) into the first multiplier input terminal 1st, and the second multiplier input terminal, 2nd, respectively. The current output of the multiplier/divider e(t) is converted to a voltage by amplifier 172 via resistor 173. The multiplier/divider output voltage e(t) is summed with Q(t) at the plus terminal of amplifier 176 via resistor 178 and resistor 280.

Figure 9:
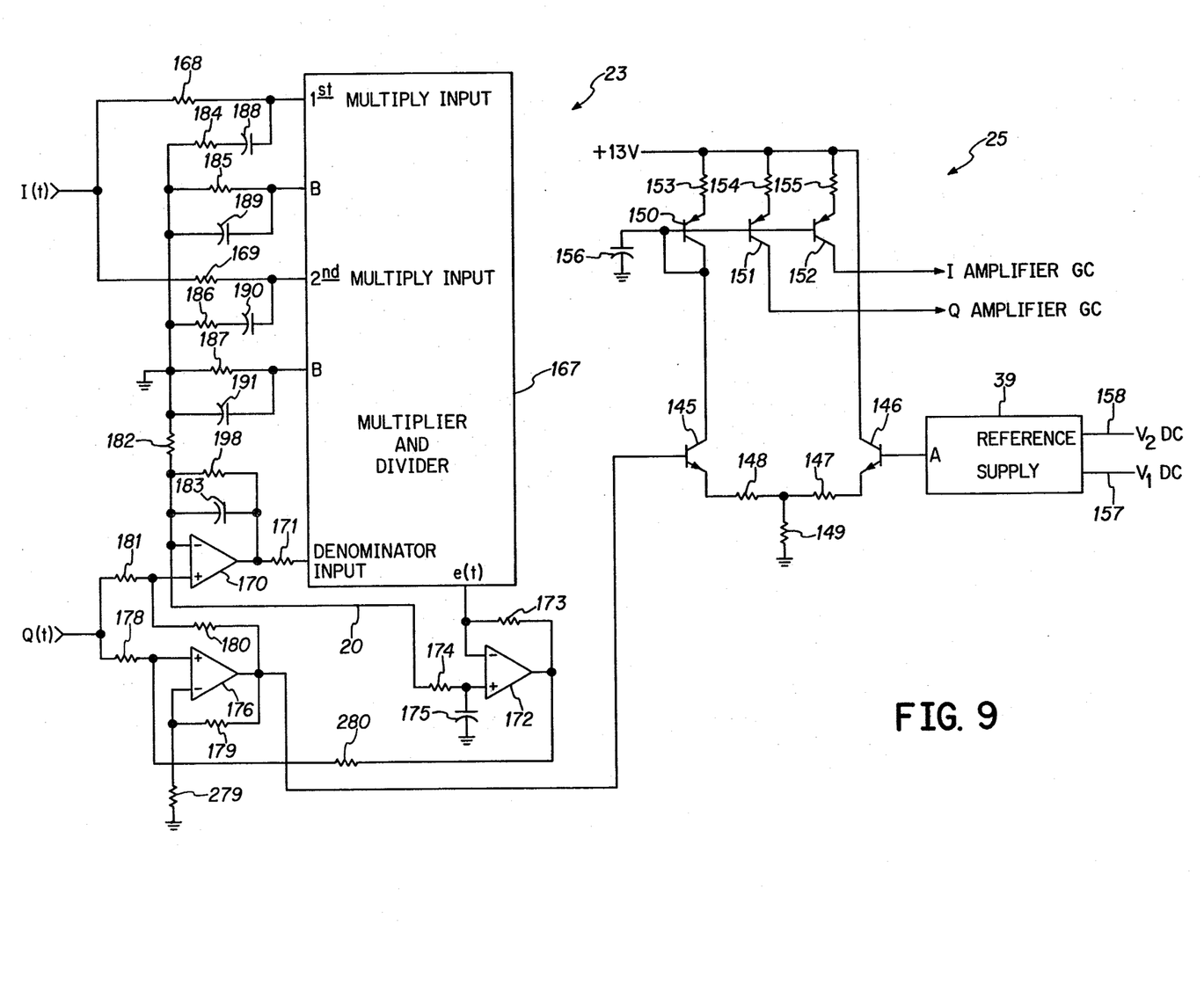

The output of amplifier 176 forms the output signal voltage E(t). E(t) is summed with the signal Q(t) at the plus terminal of amplifier 170 to provide the denominator signal, E(t)+Q(t), which is applied to the denominator input of the multiplier/divider 167. Resistor 174 provides a ground return for amplifier 172. The positive input terminal is returned to ground reference by resistor 174 and by pass capacitor 175. The voltage gain of amplifier 176 is established by feedback resistors 179 and 279. Resistor 180 converts the voltage E(t) to a current which is summed with a current that results from the conversion of Q(t) to current by resistor 181 at the positive input terminal of amplifier 170. The summation of these currents is converted to voltage at the output of amplifier 170 by resistor 198.

Frequency response of the amplifier 170 is controlled by capacitor 183 and resistor 198. The resultant voltage is converted to current by resistor 171 and applied to the denominator input of the multiplier divider 167.

Resistors 168 and 169 convert the input signal from voltage to current, and resistors 185 and 187 provide return circuits for the 1st and 2nd multiplication inputs. Resistors 184, 186 and capacitors 188, 189, 190 and 191 are used for frequency stabilizing the internal components of the multiplier/divider 167.

The comparator 25 consists of a difference amplifier which includes transistors 145 and 146 that are biased by resistors 147, 148 and 149. The difference amplifier drives the buffer transistor 150 which in turn provides the adjustment to the B terminal of the amplifier 200 that is used for the inphase gain variable amplifier 33 in the inphase circuit via the collector output of transistor 152 and to quadrature phase variable gain amplifier 35 at the B terminal of amplifier 200 via the collector of transistor 151. Biasing for the transistors 150, 151 and 152 is established by resistors 153, 154 and 155 respectively. The transistors are coupled to ground by the filtering capacitor 156.

Reference supply 39 provides three output voltages $V_1DC$ on terminal 157, $V_2DC$ on terminal 158, and the peak clipping reference voltage to the comparator 25.

Many changes and modifications in the above described embodiment of the invention can of course, be carried out without departing from the scope thereof. Accordingly, the invention is disclosed and is intended to be limited only by the scope of the appending claims.

We claim:

1. A speech processor for processing an analog signal comprising:
    gain control means for controlling the amplitude of the analog signal, the gain control means being controlled by a peak limited modulation envelope signal to provide a limited analog signal;
    Hilbert transformer means for performing a Hilbert transform on the limited analog signal to provide thereby an inphase signal and a quadrature phase signal;
    audio modulation detector means for detecting the peak limited modulation envelope signal, the audio modulation detector means includes a logic means for extracting the square root of the sum of the squares of the inphase signal and the quadrature phase signal to obtain thereby a peak limited signal, reference means for providing a peak reference signal, comparator means for comparing the peak reference signal with the peak limited signal to obtain an analog peak limited modulation signal thereby, and detector means for separating the peak limited modulation envelope signal from the analog peak limited modulation signal; and
    feedback path means for coupling the peak limited modulation envelope signal to the gain control means.

2. The speech processor according to claim 1, wherein the logic means comprises:
    a first squaring means for squaring the inphase analog signal to obtain a first squared signal;
    a second squaring means for squaring the quadrature phase signal to obtain a second squared signal;
    summing means for summing the first squared signal with the second squared signal to obtain a sum of the squares signal; and
    square root means for taking the square root of the sum of the squares signal to obtain limited signal thereby.

3. The speech processor according to claim 1, wherein the logic means comprises:
    first absolute value means for obtaining the absolute value of the inphase signal to obtain a first absolute signal;
    square means for squaring the first absolute signal to obtain a first absolute squared signal;
    second absolute value means for obtaining the absolute value of the quadrature phase signal to obtain, thereby a second absolute signal;
    1st summing means for summing the second absolute signal with the peak limited signal to obtain a denominator signal;
    divider means for dividing the first absolute squared signal by the denominator signal to obtain thereby, a quotient signal;
    2nd summing means for summing the quotient signal with the second absolute signal to obtain thereby, the peak limited signal; and
    feedback path means coupling the peak limited signal to the summing means.

4. The speech processor according to claim 1, further comprising:
    transducer means for transducing sound waves into the analog signal, the analog signal being representative of the sound waves.

5. The speech processor according to claim 1, further comprising:
    a radio transmitter means for transmitting the inphase signal.

6. A speech processor for processing an analog signal comprising:
    A Hilbert transformer means for performing a Hilbert transform on the analog signal to obtain thereby an inphase signal and a quadrature phase signal;
    1st variable gain amplifier means for amplifying the inphase signal to obtain a limited inphase signal;
    2nd variable gain amplifier means for amplifying the quadrature phase signal to obtain a limited quadrature phase signal;

audio modulation detector means for detecting a peak limited modulation envelope signal, the audio modular detection means includes a logic means for extracting the square root of the sum of the squares of the inphase signal and the quadrature phase signal to obtain thereby a peak limited signal, reference means for providing a peak reference signal, comparator means for comparing the peak reference signal with the peak limited signal to obtain an analog peak limited modulation signal thereby, and detector means for separating the peak limited modulation envelope signal from the analog peak limited modulation signal; and feedback path means for coupling the peak limited modulation signal to the first and second variable gain amplifiers, the gain of the first and second variable gain amplifier being controlled by the peak limited modulation envelope signal.

7. The speech processor according to claim 6, wherein the logic means comprises:
   a first squaring means for squaring the inphase analog signal to obtain a first squared signal;
   a second squaring means for squaring the quadrature phase signal to obtain a second squared signal;
   summing means for summing the first squared signal with the first and second squared signal to obtain a sum of the squares signal; and
   square root means for taking the square root of the sum of the squares signal to obtain the square root of the sum of the squares of the inphase signal and the quadrature phase signal to obtain the peak limited signal thereby.

8. The speech processor according to claim 6, wherein the logic means comrises:
   first absolute value means for obtaining the absolute value of the inphase signal to obtain a first absolute signal;
   square means for squaring the first absolute signal to obtain a first absolute squared signal;
   second absolute value means for obtaining the absolute value of the quadrature phase signal to obtain thereby a second absolute signal;
   1st summing means for summing the second absolute signal with the peak limited signal to obtain a denominator signal;
   divider means for dividing the denominator signal into the first absolute squared signal to obtain thereby a quotient signal;
   2nd summing means for summing the quotient signal with the second absolute signal to obtain thereby the peak limited signal; and
   feedback means for coupling the peak limited signal to the summing means.

9. The speech processor according to claim 6, further comprising:
   transducer means for transducing sound waves into the analog signal, the analog signal being representative of the sound waves.

10. The speech processor according to claim 6, further comprising:
   a radio transmitter means for transmitting the inphase signal.

11. A method of speech processing of an analog signal comprising:
   controlling the amplitude of the analog signal in response to a peak limited modulation envelope to obtain a limited analog signal;
   performing a Hilbert transform on the limited analog signal to provide thereby an inphase signal and a quadrature phase signal; and
   combining the inphase signal with the quadrature phase signal, said step of combining the inphase signal with the quadrature phase signal includes the steps of squaring the inphase signal, squaring the quadrature phase signal, summing the squared inphase signal with the squared quadrature phase signal, extracting the square root of the sum of the squares of the inphase signal and the quadrature phase signal to obtain thereby a peak limited signal, providing a peak limited reference signal, comparing the peak limited reference signal with the peak limited signal to obtain an analog peak limited modulation signal, and separating the peak limited modulation envelope signal from the analog peak limited modulation signal.

12. The method of speech processing according to claim 11, wherein the step of mathematically combining the inphase signal with the quadrature phase signal and detecting the peak limited modulation envelope signal comprises:
   obtaining the absolute value of the inphase signal to obtain a first absolute signal;
   squaring the first absolute signal to obtain a first absolute squared signal;
   obtaining the absolute value of the quadrature phase signal to obtain thereby a second absolute signal;
   summing the second absolute signal with the peak limited signal to obtain a denominator signal; and
   dividing the denominator signal into the first absolute squared signal to obtain thereby a quotient signal; and
   summing the second absolute signal with the quotient signal to obtain thereby the peak limited signal.

13. The method of speech processing according to claim 11, further comprising the step of:
   transducing sound waves into an analog signal representative of the sound waves.

14. The method of speech processing according to claim 11, further comprising, the step of:
   transmitting the inphase signal.

15. A method of speech processing for processing an analog signal comprising the steps of:
   performing a Hilbert transform on the analog signal to obtain thereby an inphase signal and a quadrature phase signal;
   amplifying with a 1st variable gain amplifier the inphase signal to obtain a limited inphase signal;
   amplifying with a 2nd variable gain amplifier the quadrature phase signal to obtain a limited quadrature phase signal;
   combining the limited inphase signal with the limited quadrature phase signal, the step of combining of the inphase signal with the quadrature phase signal includes the steps of squaring the inphase signal, squaring the quadrature phase signal, summing the squared inphase signal with the squared quadrature phase signal, extracting the square root of the sum of the squares of the inphase signal and the quadrature phase signal to obtain thereby a peak limited signal, providing a peak limited reference signal, comparing the peak limited reference signal with the peak limited signal to obtain an analog peak limited modulation signal, and separating the peak limited modulation envelope signal from the analog peak limited modulation signal, the gain of the first and second variable gain amplifier being controlled by the peak limited modulation envelope signal.

16. The method of speech processing according to claim 15, wherein the steps of mathematically combining the inphase signal with the quadrature phase signal comprises:

obtaining the absolute value of the inphase signal to obtain a first absolute signal;

squaring the first absolute signal to obtain a first absolute squared signal;

obtaining the absolute value of the quadrature phase signal to obtain thereby a second absolute signal;

summing the second absolute signal with the peak limited modulation signal to obtain a denominator signal;

dividing the denominator signal into the first absolute squared signal to obtain thereby the peak limited modulation signal;

detecting the peak limited modulation envelope signal in the peak a quotient signal; and summing the second absolute signal with the quotient signal to obtain thereby the peak limited signal.

17. The method of speech processing according to claim 15, further comprising, the step of:

transducing sound waves into an analog signal representative of the sound waves.

18. The method of speech processing according to claim 15, further comprising, the step of:

transmitting the inphase signal.

* * * * *